(12) United States Patent
Jarosz

(10) Patent No.: US 9,092,110 B2
(45) Date of Patent: Jul. 28, 2015

(54) METHOD AND SYSTEM FOR IMPLEMENTING A USER INTERFACE WITH GHOSTING

(75) Inventor: Joseph P Jarosz, Sunnyvale, CA (US)

(73) Assignee: Cadence Design Systems, Inc., San Jose, CA (US)

(*) Notice: Subject to any disclaimer, the term of this patent is extended or adjusted under 35 U.S.C. 154(b) by 1024 days.

(21) Appl. No.: 12/336,426

(22) Filed: Dec. 16, 2008

(65) Prior Publication Data

US 2010/0153888 A1    Jun. 17, 2010

(51) Int. Cl.
*G06F 3/048* (2013.01)
*G06F 17/50* (2006.01)
*G06F 3/0481* (2013.01)

(52) U.S. Cl.
CPC ........ *G06F 3/04812* (2013.01); *G06F 17/5068* (2013.01)

(58) Field of Classification Search
CPC ............ G06F 17/5068; G06F 17/5072; G06F 17/5081; G06F 3/0481; G06F 3/04812; G06F 3/04845; G06F 3/0484; G06F 3/0486; H05K 3/0005
USPC ........................................................ 715/816
See application file for complete search history.

(56) References Cited

U.S. PATENT DOCUMENTS

| | | | | |
|---|---|---|---|---|
| 5,535,134 A * | 7/1996 | Cohn et al. | ..... | 716/112 |
| 5,638,505 A * | 6/1997 | Hemenway et al. | ..... | 715/769 |
| 5,754,178 A * | 5/1998 | Johnston et al. | ..... | 715/769 |
| 5,987,240 A * | 11/1999 | Kay | ..... | 716/112 |
| 6,268,853 B1 * | 7/2001 | Hoskins et al. | ..... | 700/83 |
| 6,380,954 B1 * | 4/2002 | Gunther | ..... | 715/764 |
| 6,470,489 B1 * | 10/2002 | Chang et al. | ..... | 716/52 |
| 6,928,618 B2 * | 8/2005 | Kohls et al. | ..... | 715/764 |
| 7,114,132 B2 * | 9/2006 | Yaguchi | ..... | 716/115 |
| 7,475,000 B2 * | 1/2009 | Cook et al. | ..... | 703/14 |
| 7,661,069 B2 * | 2/2010 | Lindsay et al. | ..... | 715/767 |
| 2002/0054149 A1 * | 5/2002 | Genise et al. | ..... | 345/810 |
| 2004/0174382 A1 * | 9/2004 | Staples et al. | ..... | 345/619 |
| 2004/0225968 A1 * | 11/2004 | Look et al. | ..... | 715/778 |
| 2006/0248491 A1 * | 11/2006 | Lindberg et al. | ..... | 716/11 |
| 2006/0256084 A1 * | 11/2006 | Hey et al. | ..... | 345/157 |
| 2007/0063997 A1 * | 3/2007 | Scherer et al. | ..... | 345/419 |
| 2007/0083837 A1 * | 4/2007 | Gristede et al. | ..... | 716/9 |
| 2007/0250801 A1 * | 10/2007 | Johnson | ..... | 716/11 |

(Continued)

OTHER PUBLICATIONS

Szekely. Standardizing the Interface Between Applications And CIMSs. ACM 0-89791-335-3/89/0011/0034; 1989.*

(Continued)

*Primary Examiner* — Amy M Levy
(74) *Attorney, Agent, or Firm* — Vista IP Law Group, LLP

(57) ABSTRACT

An approach is described for implementing a GUI that an account for illegal operations by the user. Visual ghosting is implemented that includes separation support. If an object is manipulated into an impermissible/unacceptable configuration, ghosting separation is performed to display multiple ghost images, where a first ghost image shows a legal configuration of the object and a second ghost image shows the current configuration of the object. The second ghost continues to track the user's manipulation of the object until a legal configuration is achieved. The improved approach provides a visual representation that corresponds to the expected end result, but is also be useful to track the user's actions if there is a violation.

27 Claims, 11 Drawing Sheets

(56) References Cited

U.S. PATENT DOCUMENTS

2008/0252663 A1* 10/2008 Kripac et al. .................. 345/681
2009/0007062 A1* 1/2009 Gilboa ........................... 717/105
2010/0005438 A1* 1/2010 Nakamura ...................... 716/11

OTHER PUBLICATIONS

Hurd .Formal Verification of Chess Endgame Databases, in Theorem Proving in Higher Order Logics: Emerging Trends Proceedings, Jul. 2005, pp. 85-100.*

Marsland. Computer Chess and Search, 1991. Article prepared for the 2nd edition of the Encyclopedia of Artificial Intelligence.*

World Chess Federation—Laws of Chess. http://www.fide.com/component/handbook/ retrieved Aug. 23, 2011.*

Singh, Database Systems: Concepts, Design and Applications. Section 21.6 Spatial Databases. © 2006 pp. 637-640.*

Riepe, Michael A. Transistor Level Micro Placement and Routing for Two-Dimensional Digital VLSI Cell Synthesis. EE Dissertation, University of Michigan [retrieved from] http://www.eecs.umich.edu/techreports/cse/1999/CSE-TR-390-99.pdf [on] Nov. 18, 2013.*

* cited by examiner

METHOD AND SYSTEM FOR IMPLEMENTING A USER INTERFACE WITH GHOSTING

BACKGROUND

The invention is directed to an improved approach for implementing a graphical user interface.

A graphical user interface (GUI) is a type of interface that uses graphical image elements to allow users to interact with and control a computing or electronic device. Instead of requiring a user to type commands using some form of text, the GUI control and navigation of the interface based upon direct manipulation of graphical elements.

There are many types of computing applications that utilize graphical user interfaces to enable users to visually edit and modify the configuration of objects on a screen. For example, many types of drawing and computer aided design (CAD) tools are implemented using GUI-style interfaces. The GUI interface permits the user to visually manipulate the configuration of objects that are being drawn and displayed on the screen of a display device. In many of these GUIs, the user will select an object and can manipulate or edit the object using a pointing device such as a mouse pointer. For operations that involve moving an object, the GUI allows the user to manipulate an object by dragging and dropping the object from a first location to a second location. Dragging, or ghosting as it's sometimes called, is commonplace in modern graphical editors and is accomplished by having the user select the object(s) they intend to move and initiates some sort of "move" command where the selected objects appear to be attached or glued to the pointer as it moves across the screen.

When presenting images of objects using a GUI, it is very helpful to the user if the visual representation displayed to the user is a close approximation of the end result of the user's actions. This correspondence between the visual representation and the actual end result is often referred to as "WYSIWYG" (What You See Is What You Get), and is a desirable aspect of many GUI-based systems. This correspondence is important to provide visual feedback to the user regarding where the objects will end up once the move operation is completed. In addition, the GUI should provide visual continuity to the user during the ghosting of the objects as the user moves the pointer across the screen. This aspect of the GUI lowers the cognitive load on the user, since the user does not have to figure out where the object will end up and increases the user's confidence in the tool.

However, problems may occur if the user commits an error or creates some sort of configuration violation when manipulating an object using the GUI. For example, in some applications, overlapping objects are not permitted and it is a violation if the user attempts to move one object into the space already being occupied by another object. The user would be allowed to select, drag, and drop the objects as long as the end result does not violate the above mentioned restriction.

When moving an object, it is desirable to let the user to see where the objects would end up on the screen if the user completes the move operation, but the intended move operation by the user may cause the object to be moved to an impermissible/unacceptable location on the screen. It is desirable to let the user see, at all times, where the objects would end up on the screen if the user completes the move operation, but the problem is that the user may have moved the object to an impermissible location. Conventional GUI implementations fail to provide acceptable approach for resolving this problem.

Therefore, there is a need for an improved approach to implementing a GUI that an account for illegal operations by the user. The improved approach should provide a visual representation that corresponds to the expected end result, but should also be useful to track the user's actions even if there is a violation.

SUMMARY

Some embodiments of the present invention provide an improved approach for implementing a GUI that accounts for illegal operations by the user. According to some embodiments, visual ghosting is implemented that includes separation support. If an object is manipulated into an impermissible configuration, ghosting separation is performed to display multiple ghost images, where a first ghost image shows a legal configuration of the object and a second ghost image shows the current configuration of the object. The second ghost continues to track the user's manipulation of the object until a legal configuration is achieved. The improved approach provides a visual representation that corresponds to the expected end result, but is also be useful to track the user's actions if there is a violation.

Other additional objects, features, and advantages of the invention are described in the detailed description, figures, and claims.

DETAILED DESCRIPTION

Embodiments of the present invention provide a system, method, and product for implementing an improved user interface. According to some embodiments, visual ghosting is implemented that includes separation support. If an object is manipulated into an impermissible configuration, ghosting separation is performed to display multiple ghost images, where a first ghost image shows a legal configuration of the object and a second ghost image shows the current configuration of the object. The second ghost continues to track the user's manipulation of the object until a legal configuration is achieved.

This approach provides visual feedback to the user regarding where the objects will end up once the move operation is completed, even if the user manipulates an object into an impressible configuration. Moreover, the invention provides visual continuity to the user during the ghosting of the objects as the user moves the pointer across the screen.

Providing ghost separation is much more useful and usable to GUI users as compared to alternative approaches that do not provide such separation. For example, consider an alternative approach in which the GUI strictly follows WYSIWYG principles and just drop an object into a location specified by the user, even if the location is an illegal location. This approach is less desirable because it fails to visually present a legal alternative configuration for the object. Another approach could be to only visually display a legal location for the object when the user has shifted the pointer sufficiently to move the object to an illegal location, whereby the visually displayed location of the object no longer tracks the movement of the mouse pointer (since the mouse pointer has moved to a position that would correspond to an illegal location for the object). This approach is less desirable since it violates WYSIWYG principles and even though the dropped objects would be placed somewhere legal, the location that would appear to be random to the user, causing a lack of visual continuity where the pointer and the objects being dragged would appear to be disjoint.

Figure 1:
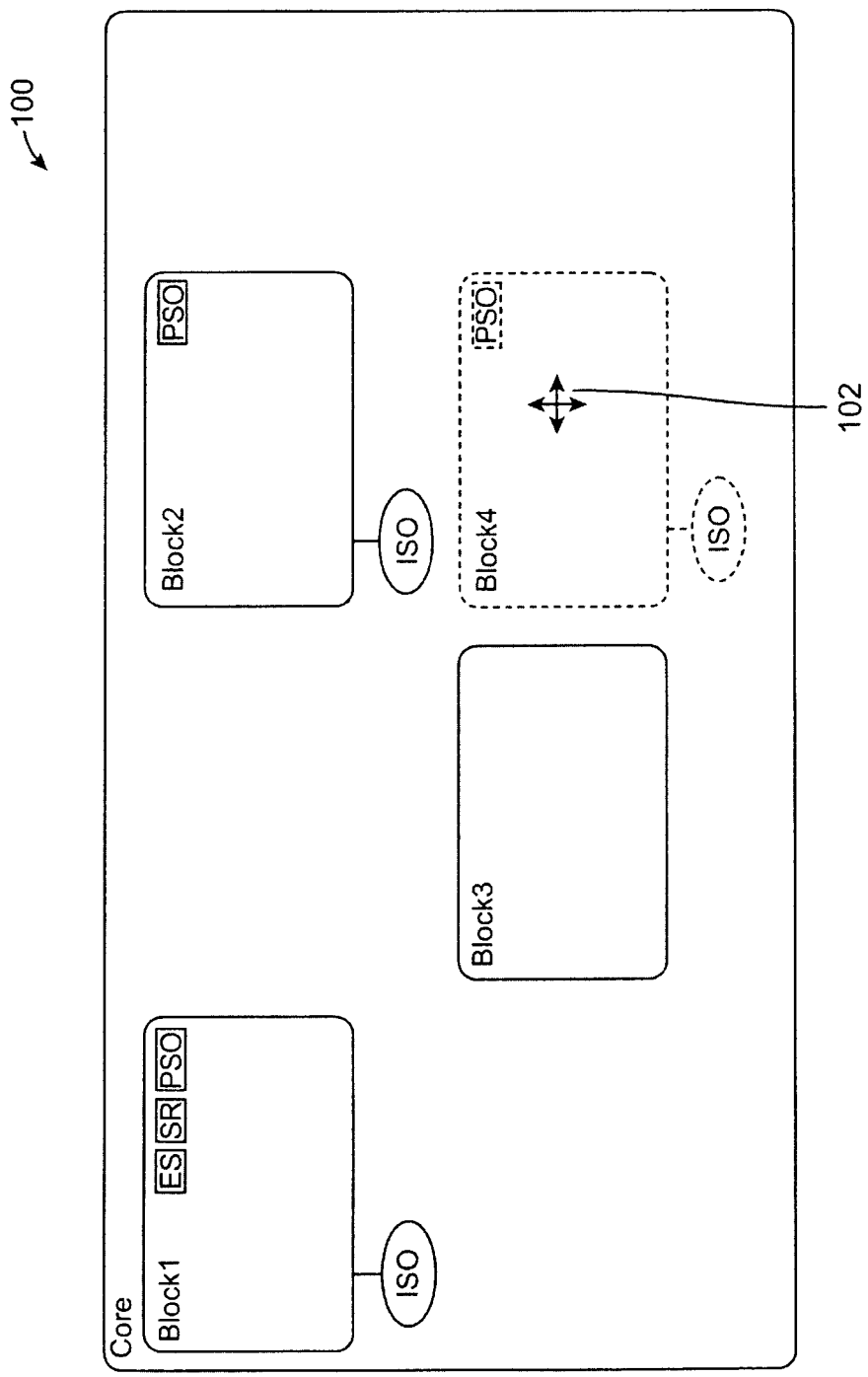
FIG. 1 depicts an example graphical user interface according to some embodiments of the invention.

FIG. 1 shows a user interface 100 that displays four objects, including block1, block2, block3, and block4. User interface 100 is an example of a GUI that may be used to manipulate or edit the configuration of its disclosed objects. For example, a mouse pointer 102 may be used by a user to select block4 and to move the position of block4 from a first location to a second location.

Figure 2:
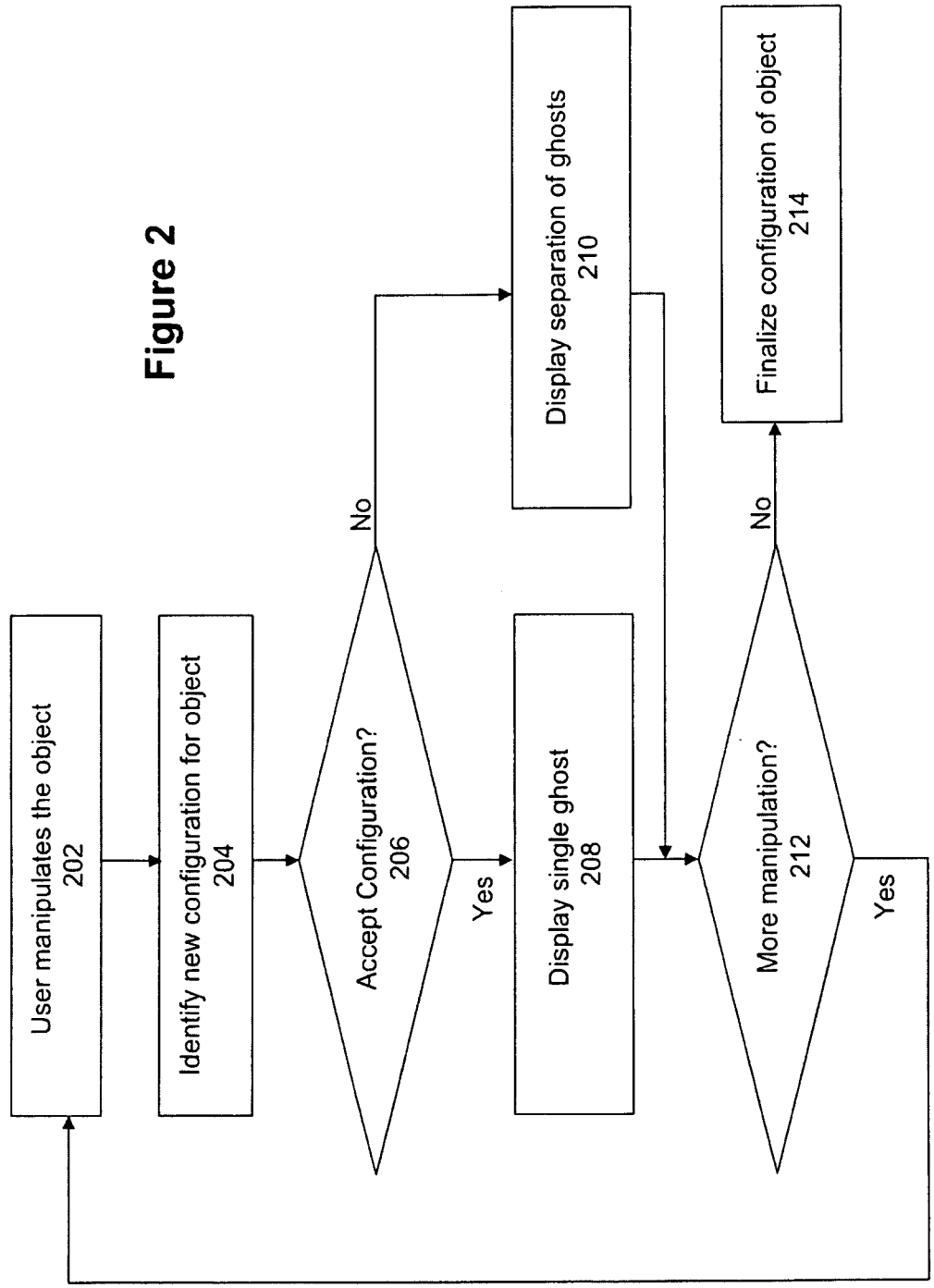
FIG. 2 illustrates a flow of an approach for implementing ghosting with separation according to some embodiments of the invention.

FIG. 2 shows a flowchart of a process for implementing some embodiments of the invention. At 202, the user manipulates the object to edit or modify the configuration of the object. For example, the user may manipulate the placement or location of the object by moving the object from a first location to a second location. Any suitable control mechanism can be used to manipulate the object. An exemplary approach is to provide the user with the ability to use a mouse pointer to select the object, and while the object is selected, to shift the object from one location to another. It is noted, however, that other control mechanism may also be employed to manipulate the object. For example, keyboard controls and menu mechanisms may be used to manipulate the object configuration. Moreover, while many illustrative examples shown herein are directed at manipulating the location of an object, it is noted that any configurable attribute or parameter of the object may be manipulated within the scope of the invention, such as but not limited to the size or shape of the object. It also should be appreciated that the modification of a configuration can include manipulating a combination of attributes or parameters.

At 204, the new configuration of the object is recognized. For example, if the user had manipulated the location of the object, then 204 would identify the new location to which the object is moved. If the user has manipulated the size of the object, then the new size/boundaries of the object is recognized at 204.

A determination is made at 206 whether the new configuration is acceptable or legal. This type of determination is being made because there are often object-related configuration rules that govern whether or not an object can be configured in certain ways. For example, there may be rules that preclude one object from overlapping or intersecting another object. Similarly, there may be spacing rules that preclude one object from being within a certain spacing distance to another object. Any suitable rule may be employed within the scope of the invention, including rules that govern the size, shape, density, or adjacency of objects.

If the configuration is acceptable or legal, then at 208 the object is displayed using a single ghosted image of the object, where the single image provides a visual indicator to the user that the configuration is a legal or acceptable configuration. The ghosted image visually displays the current configuration of the object.

If the configuration is not acceptable or has violated a configuration rule, then an image separation occurs at 210 to provide a visual indication to the user of the rule violation. According to some embodiments, the image separation causes a first ghost image of the object to continue to represent the current configuration of the object, while a second ghost image is displayed that represents a system-identified legal or acceptable configuration of the object. For example, if the user has manipulated the location of the object so that it is no longer in an acceptable location, then the first ghost image will display the current unacceptable location while a second ghost image will display a previously acceptable location. In this way, the user is provided with a WYSIWYG-like interface to the current configuration, while still being given the option of knowing that there is a problem with the configuration, and also being informed of an acceptable solution.

A determination is made at 212 whether there are any further manipulations being made by the user. If the user is still manipulating the object, e.g., still moving the location of the object, then the process returns back to 202 to await further manipulations by the user.

If the previous manipulation results in an unacceptable or illegal configuration, then process could proceed until the user has manipulated the object to a configuration that is acceptable and does not violate any rules. At that point, the two separated ghost images that were implemented by 210 are merged together, leaving only a single ghost image that shows the current, and acceptable, configuration of the object.

When the user has finished manipulating the object, then the object configuration is finalized at 214. For example, the user could make this clear by releasing the mouse selection button for the object (which was depressed to make the original selection of the object for manipulation). At this point, the ghosting disappears and the object returns to a solid image display in the user interface.

Figure 3:
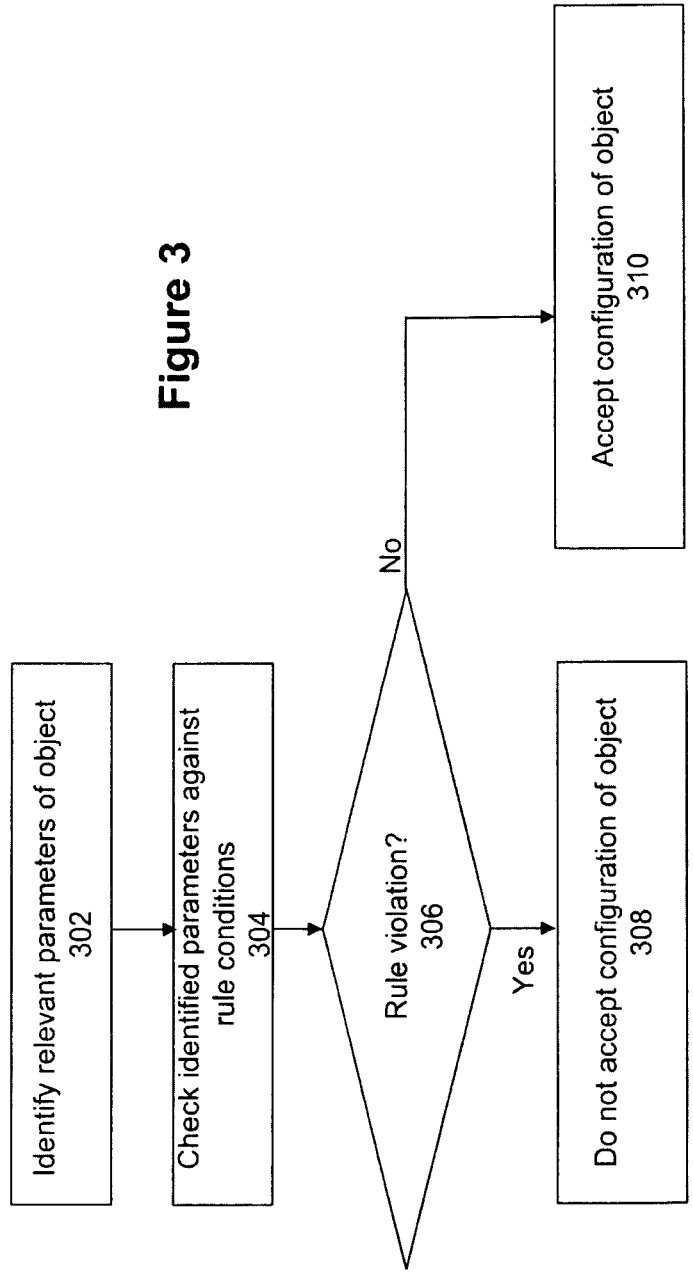
FIG. 3 illustrates a flow of an approach for determining whether an object configuration is acceptable according to some embodiments of the invention.

FIG. 3 provides a more detailed flowchart for the action 206 of determining whether the configuration of the object by the user is acceptable. At 302, the relevant parameters of the object for the new configuration are identified. For example, assume that the user manipulated the object to move from one position to another. Action 302 would be taken to identify the new location of the object, e.g., based upon a change in coordinate for the object such as a $\Delta X$ and a $\Delta Y$ to represent coordinate changes in the object position. As another example, if the user manipulated the size of the object, then action 302 is taken to identify the boundary of the change in dimensions or area of the object.

At 304, the identified parameters are checked against rule conditions that have been established for the user interface. For example, a rule may have been established that establishes a limit on the size or area of an object. If the user manipulates the size or dimension of an object, then the new dimension/size of the object is checked at 304 against the limits established by the rules.

A determination is made at 306 whether the user configuration for the object causes a rule violation. If there is a rule violation, then at 308, the new configuration is rejected. If the user configuration does not cause a rule violation, then at 310, the new configuration is considered acceptable.

Figure 4:
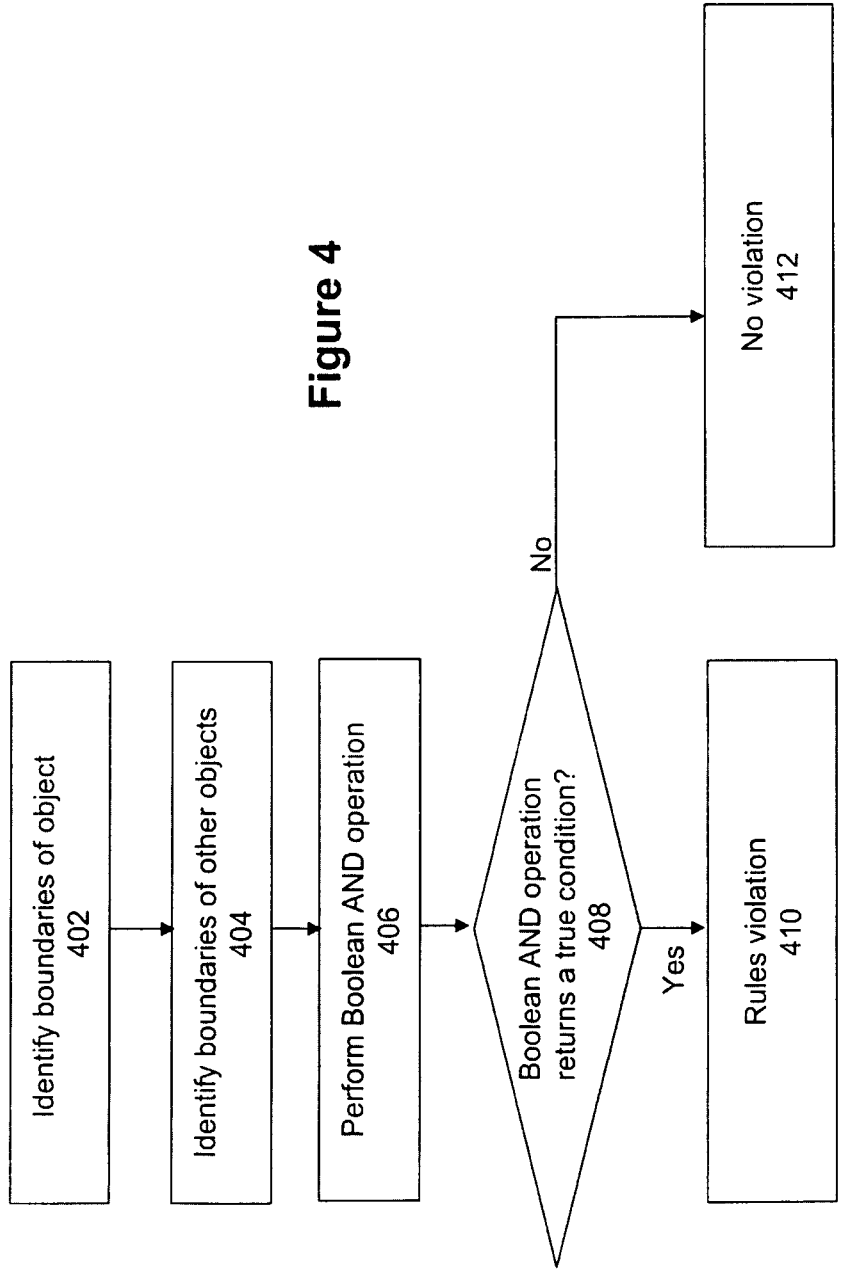
FIG. 4 illustrates a flow of an approach for checking for an overlap violation according to some embodiments of the invention.

FIG. 4 provides a specific example of an approach to check for violations of an overlap rule. An overlap rule establishes a condition in which it is deemed unacceptable if any object overlaps with another object. At 402, the process identifies the boundaries of the object that has been manipulated. The manipulation may have changed, for example, the location, size, shape, or dimensions of the object. These changes will cause the object to be associated with boundaries/edges that are different from its original boundaries/edges.

The boundaries, edges, and/or shapes of other objects are identified at 404. A Boolean AND operation is performed at 406 between the object that has been manipulated and the other objects on the interface. In some embodiments, a search window is created that limits this operation to only nearby objects.

If the Boolean AND operation presents a true condition at 408, then this means that the manipulated object overlaps with another object. Therefore, a rules violation for the overlap will be identified at 410. If, however, the Boolean AND operation returns a false condition, then an overlap does not exist between the manipulated object and other objects in the user interface.

Figure 5:
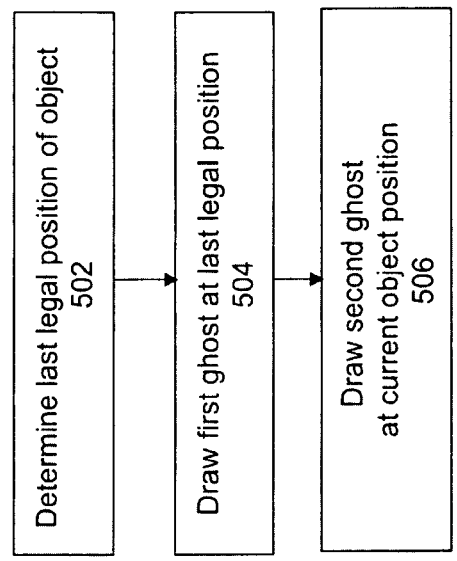
FIG. 5 illustrates a flow of an approach for drawing ghosting images with separation according to some embodiments of the invention.

FIG. 5 shows a flowchart of an approach to modify the user interface display based upon user manipulation of objects if a rules violation is detected according to some embodiments of the invention. At 502, the last legal configuration of the objected is determined. For example, if the object is moved such that it overlaps with another object causing a rule violation for overlaps, then 502 will determine the last position for the object in which the object does not overlap with another object.

At 504, a first ghost will be drawn for the current configuration of the object. For example, if the user manipulation causes a change in position for the object, then the first ghost will visually display a ghosted image of that object in its currently manipulated location. The display device, such as a monitor, is manipulated to draw and display a visual representation of the current configuration of the object, e.g., based upon the current location and positioning by the user of the mouse pointer.

At 506, a second ghost will be drawn for the last legal configuration of the object. If the user manipulation causes the object to move to a location that is currently illegal, then the second ghost will visually provide a ghosted image of the object in a legal position for the object (identified in 502). The display device is manipulated to draw and display a visual representation of the last legal configuration of the object. In an alternative embodiment, instead of identifying and displaying the last legal configuration, other legal configurations may be displayed because they may be optimal than the last legal configuration, such that they provide a better or more desirable location, spacing separation, size, or functional configuration. Therefore, 506 may configure the display device to display the more optimal legal configurations rather than the "last" legal configuration.

The display device can be configured to show distinct visual differences between the manipulated objects and the different ghost images of that object. Shading and color choices can be selected to highlight and visually emphasize the distinctiveness between the different image elements on the display. For example, the ghost image for the current object location can be given a different shading or level of transparency as compared to the ghost image for the visual representation of the legal position, which are both visually different from the other objects not currently being manipulated by the user.

When the user manipulates the object to an acceptable/legal configuration, then the separated image will re-combine and only a single ghost image will be displayed at that point for the object.

Illustrative Example

This document will now describe an illustrative example of the invention used in a computer aided design (CAD) system, such as an electronic design automation (EDA) system for implementing an electronic design. Such systems typically include a graphical user interface that allows a designer to manipulate electronic components and design elements for an electronic design.

To design an integrated circuit, an electronic designer first creates high level behavior descriptions of the integrated circuit (IC) device using a high-level hardware design language. An EDA system typically receives the high level behavior descriptions of the IC device and translates this high-level design language into netlists of various levels of abstraction using a computer synthesis process. A netlist describes interconnections of nodes, cells, and/or components on the chip and includes information of circuit primitives such as transistors and diodes, their sizes and interconnections, for example. An integrated circuit designer may use a set of EDA application programs to create a design layout from a logical circuit design, where the layout includes geometric shapes to represent the various electrical components on an integrated circuit and to represent electronic and circuit IC components as geometric objects with varying shapes and sizes.

Many designers of electronic systems have moved to a methodology known as Block Based Design ("BBD"), in which a system is designed by integrating a plurality of existing component design blocks. In recent years, many companies and organizations have created entire libraries of component design blocks and other units of electronic design (also referred to in the art as "intellectual property blocks", "IP blocks", "IP components", or "cores"). It is very common for modern electronic designers to create custom IC designs by incorporating and integrating IP blocks that perform different functions.

Figure 6:
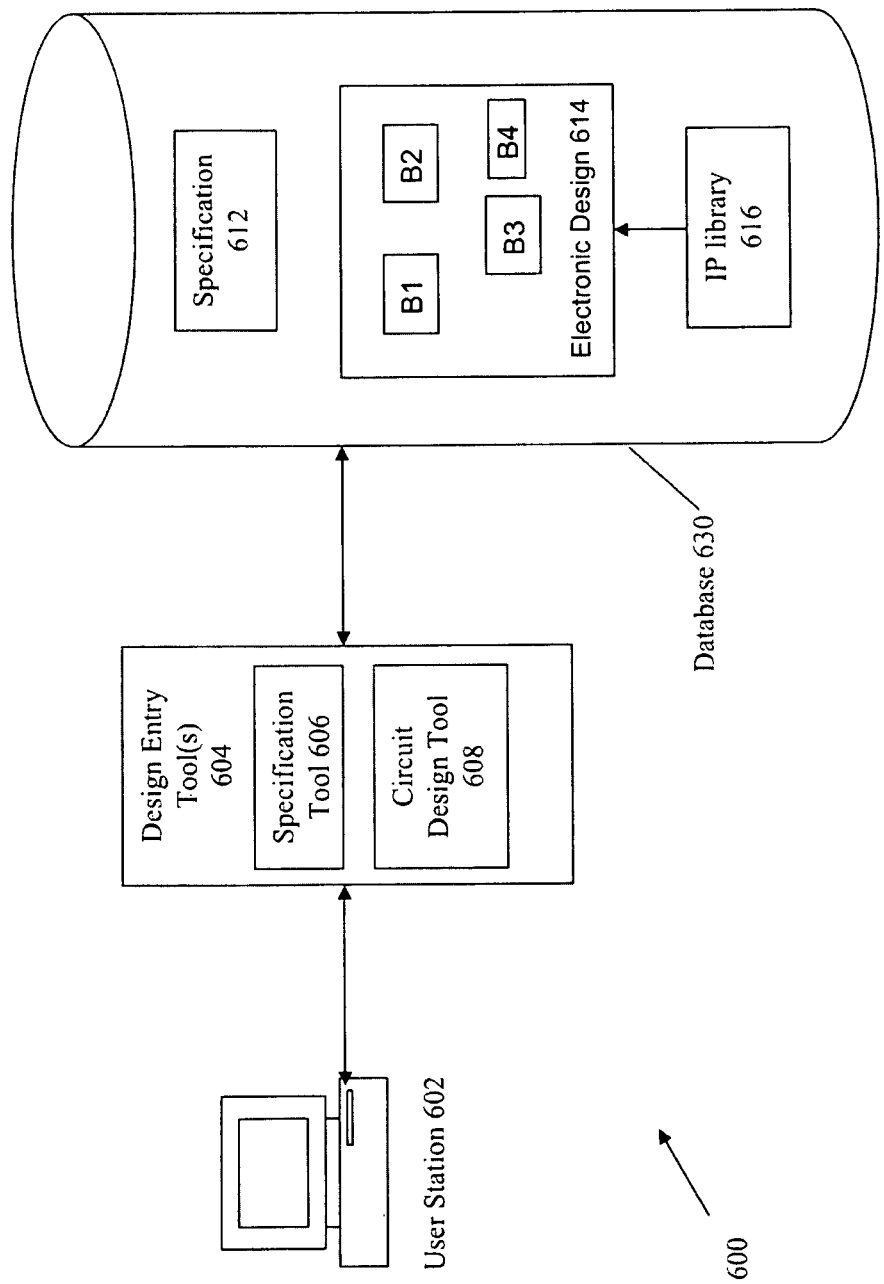
FIG. 6 illustrates a system for performing electronic design entry according to some embodiments of the invention.

FIG. 6 shows an architecture of a system 600 for performing deign entry of an electronic design according to some embodiments of the invention. System 600 comprises one or more users at one or more user stations 602 that access design entry tools 604 to create or edit an electronic design 614. The user station 602 may be associated with a database 630 or other computer readable medium that holds a data regarding the user's electronic design 614 and/or one or more specifications 612 relating to the electronic design 614. The one or more specifications 612 comprise any set of information or parameters that the user has developed to determine the requirements of the user's electronic design 614 and of cells and blocks that are needed to implement the electronic design 614. For example, the specification 612 could include details of requirements for one or more IP blocks for the electronic design 614, such as the function, process, technology node, size, acceptable power parameters, acceptable leakage parameters, and gate count of a desired IP block. The designer may user a specification tool 606 to create the specification 612 for the new electronic design. The database 630 may also be used to store the IP blocks 616 used in the electronic design 614.

A circuit design tools 608 may be used by the designer to create and edit the electronic design. The example electronic design 614 shows four blocks B1, B2, B3, and B4 arranged within the layout. The circuit design tool 608 comprises a graphical user interface that allows the user to visually manipulate the placement and configuration of IP blocks and other design components for the electronic design 614. In particular, the graphical user interface permits the user to drag and drop blocks from one location to another location within the layout of the electronic design 614.

Figure 7A:
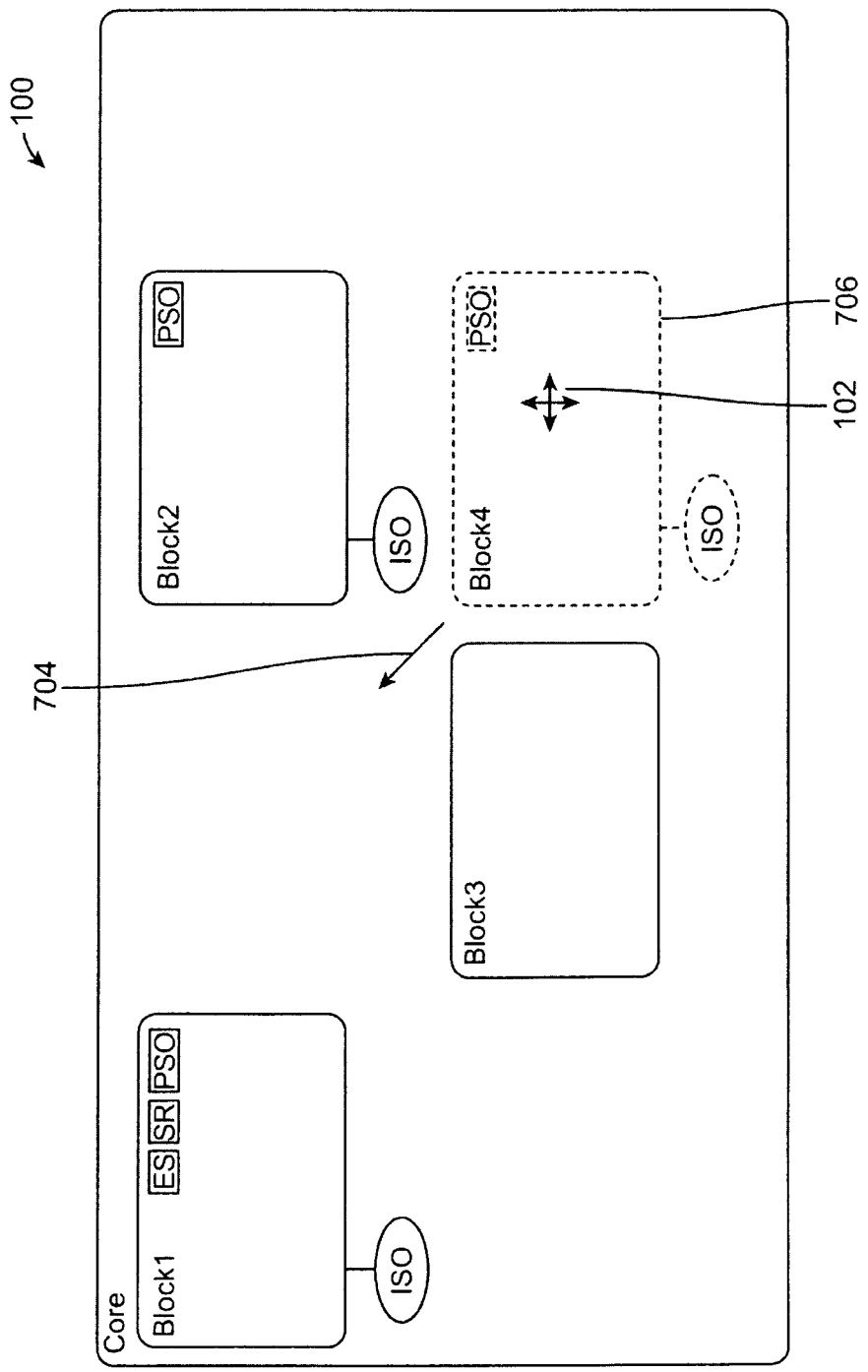
FIGS. 7A-D provide an illustrative example of ghosting with separation for a graphical user interface according to some embodiments of the invention.

FIG. 7A reproduces the example user interface 100 of FIG. 1 that currently displays block1, block2, block3, and block4. User interface 100 is an example of a GUI that may be used in a design entry tool to manipulate or edit the configuration of its disclosed IP blocks or electronic components. For example, a mouse pointer 102 may be used by a user to select an IP block and to shift the position of the selected block from a first location to a second location.

Assume that that user will be selecting and moving block4 in the direction of the arrow 704. To accomplish this, the user will use the mouse pointer 102 to select block4 and will move the mouse pointer in the direction of arrow 704. Because the user has selected block4, block4 will be shown as a ghosted image in the user interface 100. The objects not presently being manipulated (block1, block2, and block3) are presented as solid-shaded and colored image elements so that the non-manipulated blocks are represented visually different from the block being manipulated (shading not shown).

At the current location of block4 shown in FIG. 7A, block4 does not overlap with any other objects. Therefore, block4 is in a legal and acceptable location according to the overlap rules that were described above. As a result, only a single ghosted image of block4 is displayed in FIG. 7A at the currently established position of the manipulated object (i.e., block4).

Figure 7B:
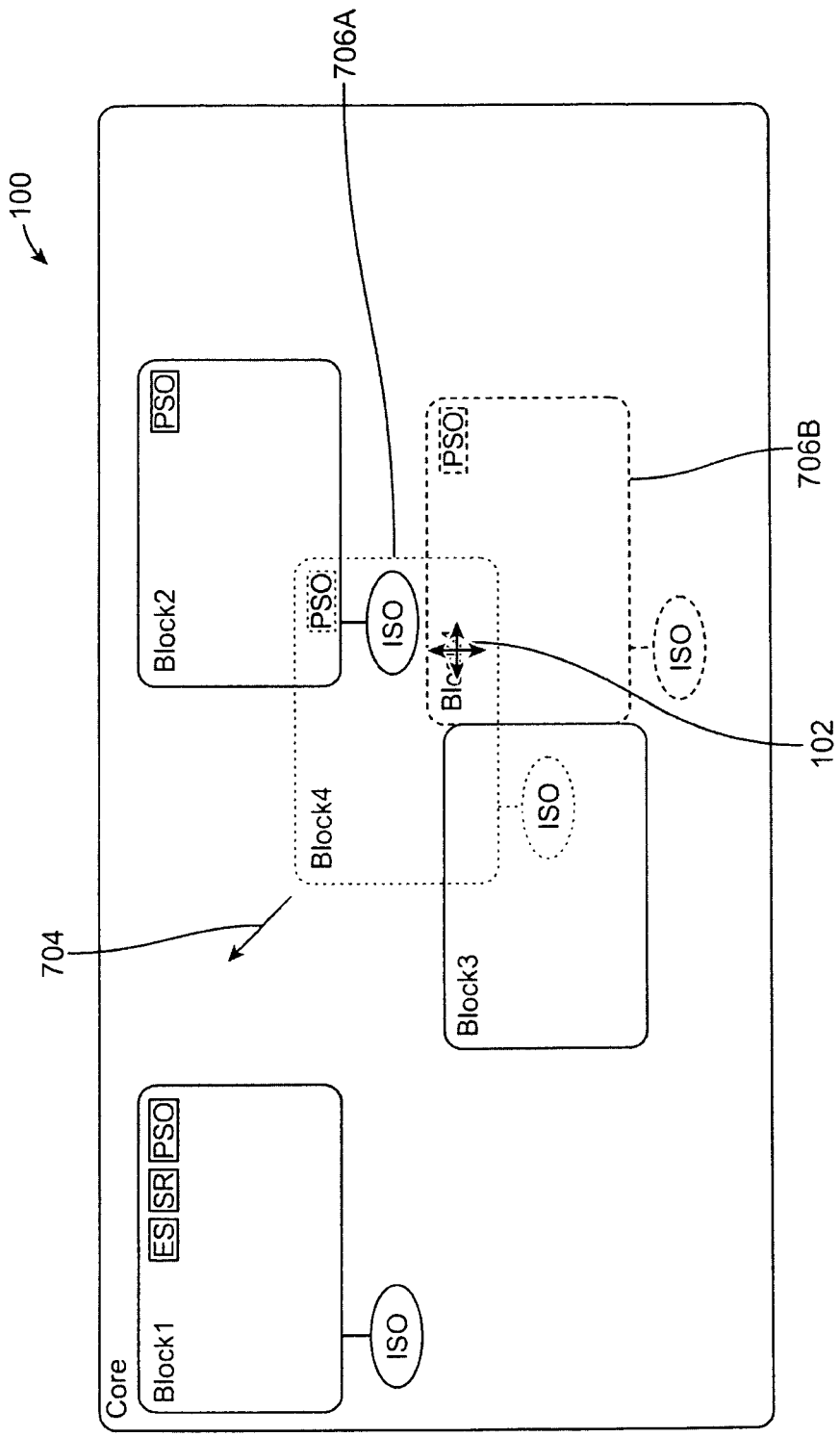

However, as block4 is moved in the direction of arrow 704, it is evident that block4 will begin to overlap with other objects. Turning to FIG. 7B, this figure shows the mouse pointer 102 being moved such that block4 has a current position as shown by ghosted image 706*a*. This current position results in overlaps between block4 and both block2 and block3. Therefore, block4 is in an illegal and unacceptable location because it violates the overlap rules that were described above.

As a result, the ghosted image 706 is separated into two distinct ghosted images. Ghosted image 706*a* is used to visually display the current location of block4 based upon the current position of the mouse pointer 102. Ghosted image 706*b* is used to visually display the last legal position of block4 before movement of the mouse pointer 102 caused block4 to move to an illegal position. Ghost 706*b* shows the final location of the objects if the operation where to be completed at those moments.

Figure 7C:
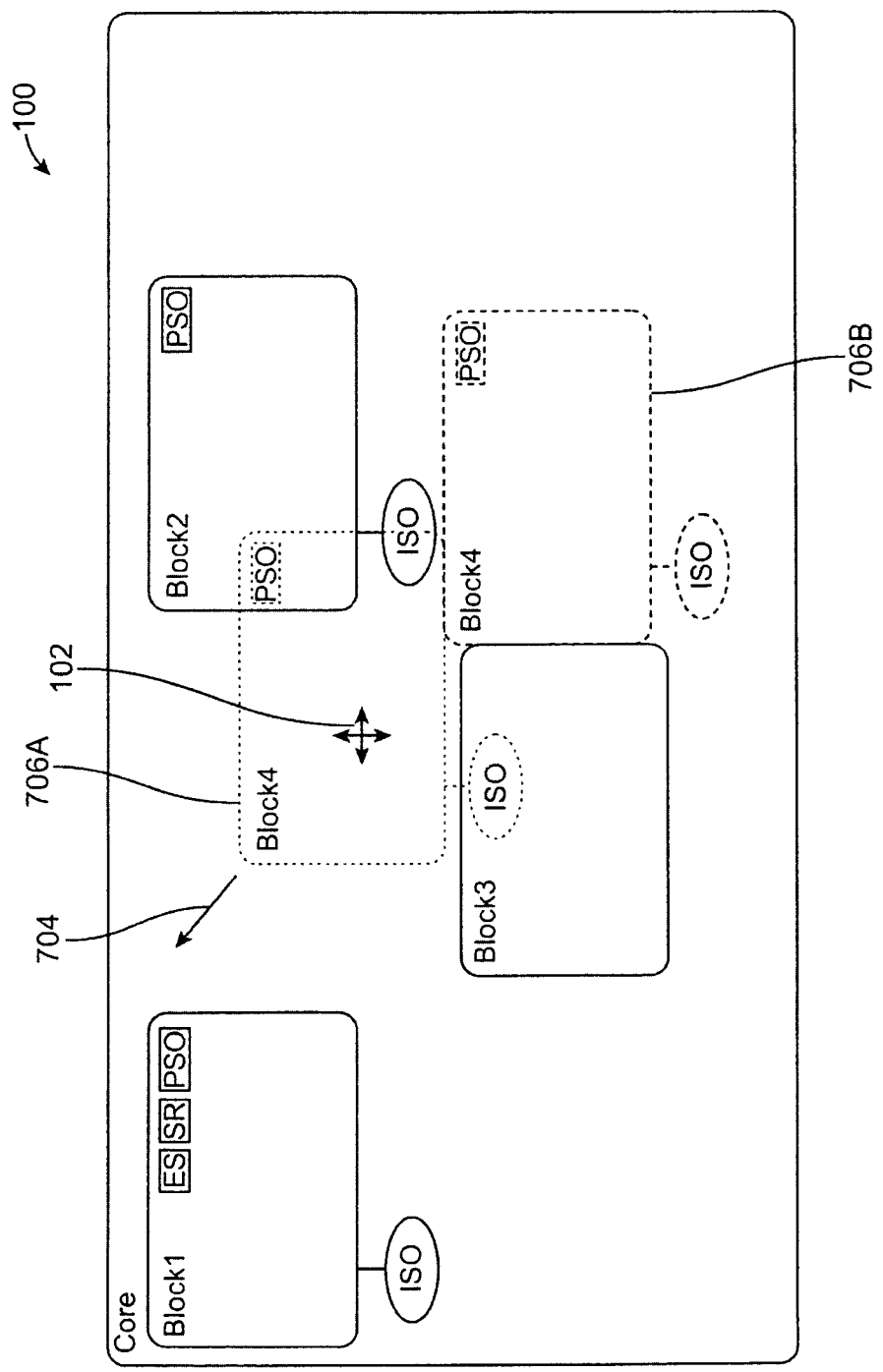

FIG. 7C shows the further movement of the mouse pointer 102 in the direction of arrow 704. At this point, block4 has moved far enough such that it no longer overlaps with block3. However, block4 still overlaps with block2. Therefore, block4 is still represented by two distinct ghost images. As previously noted, ghosted image 706*a* visually displays the current location of block4 and ghosted image 706*b* visually displays the last legal position of block4 before movement of the mouse pointer 102 caused block4 to move to an illegal position.

Figure 7D:
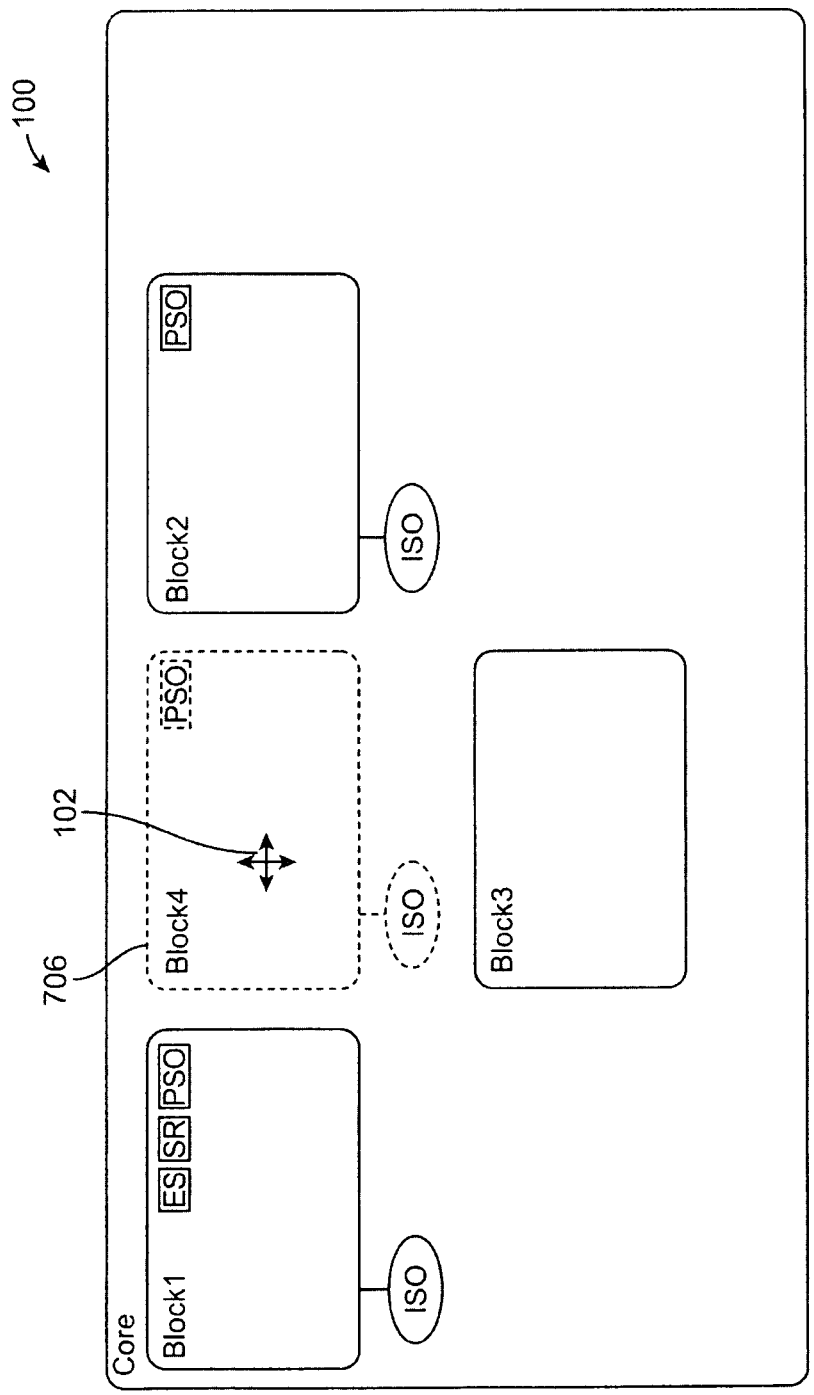

FIG. 7D shows the interface after block4 has been moved until it reaches a clear location on the layout. At this point, block4 does not overlap with any other objects. As such, the two ghosts can merge into a single ghost image 706 for block 4.

Therefore, what has been described is an improved approach for implementing a graphical user interface that provides numerous advantages. By providing ghost separation, the user is provided with visual feedback regarding where the objects will end up once the move operation is completed, even if the user manipulates an object into an impressible configuration, giving visual continuity to the user during the ghosting of the objects as the user moves the pointer across the screen. In addition, the user is given a separate visual indicator of a legal location for the object. The improved approach provides a visual representation that corresponds to the expected end result, but is also be useful to track the user's actions if there is a violation.

System Architecture Overview

Figure 8:
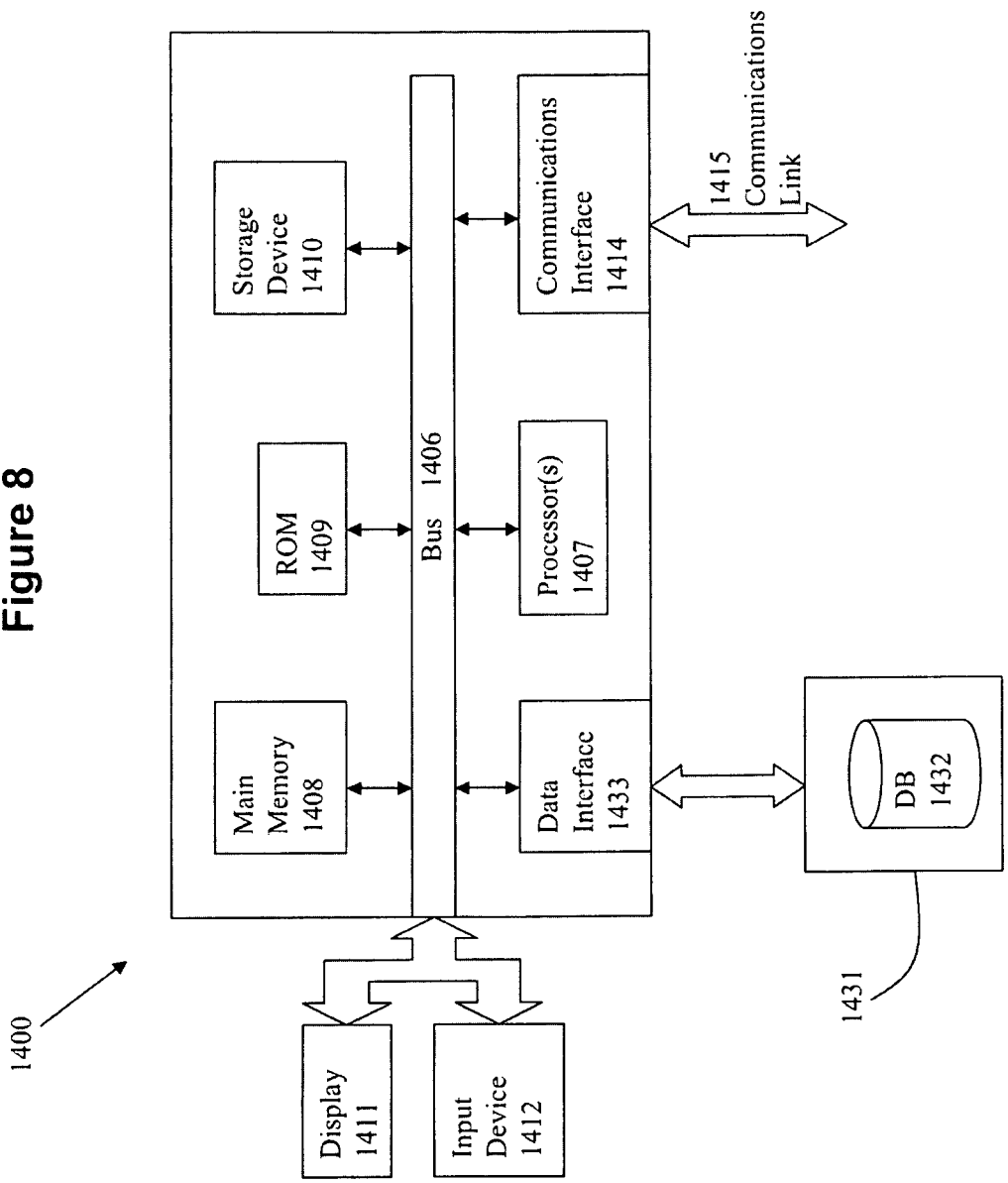
FIG. 8 shows an architecture of an example computing system with which the invention may be implemented.

FIG. 8 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer program product that includes a non-transitory tangible computer readable medium, the computer readable medium comprising a plurality of computer instructions which, when executed by a processor, cause the processor to execute a process for implementing a graphical user interface displayed on a display device, the process comprising:
receiving an instruction to move by direct user manipulation an object of an electronic design layout having one or more circuit component layout rules in the graphical user interface from a first location to a new location;
identifying a new configuration for the object corresponding to a second location of the object while performing the direct user manipulation;
determining whether the new configuration for the object is acceptable by evaluating at least one of the one or more circuit component layout rules;
configuring a display device to display a single image when the new configuration is acceptable, where the single image corresponds to the new configuration for the object; and
configuring the display device to simultaneously display a separation of images for the object when the new configuration is not acceptable by violating the at least one of the one or more circuit component layout rules, where the separation of images comprises a first display image of the object at the new configuration for the object and a second display image of the object at a last acceptable configuration for the object before movement of the object to the new configuration violates the at least one of the one or more circuit component layout rules.

2. The computer program product of claim 1 in which the object is moved to an acceptable configuration after being in a state in which the object is in an unacceptable configuration, where the first and second display images are merged into the single image corresponding to the new configuration that is acceptable.

3. The computer program product of claim 1 in which the act of determining whether the new configuration for the object is acceptable is performed by identifying one or more relevant parameters for the object at the new configuration and checking the one or more relevant parameters against the one or more circuit component layout rules of an electronic design layout to determine if there is a violation of a rule condition.

4. The computer program product of claim 3 in which the one or more circuit component layout rules corresponds to an overlap rule, where the overlap rule prohibits a first object from overlapping a second object.

5. The computer program product of claim 4 in which the one or more relevant parameters comprises a location for the object, where a Boolean AND operation is performed for the object at the location against other objects to determine if the overlap rule is violated.

6. The computer program product of claim 1 in which the last acceptable configuration for the object corresponds to a last legal configuration for the object.

7. The computer program product of claim 1 in which the last acceptable configuration for the object corresponds to a configuration for the object that does not violate a circuit component layout rule of an electronic design layout.

8. The computer program product of claim 1 in which the new configuration for the object is not acceptable if the second location causes an overlap of the object with another object.

9. The computer program product of claim 1 in which the graphical user interface is an interface to a computer aided design tool for manipulating graphical design elements.

10. The computer program product of claim 9 in which the computer aided design tool comprises an electronic design automation tool for implementing electronic circuit designs and the graphical design elements comprises electronic design elements.

11. A computer implemented method for implementing a graphical user interface on a display device, comprising:
receiving an instruction to move by direct user manipulation an object of an electronic design layout having one or more circuit component layout rules in the graphical user interface from a first location to a new location;
identifying a new configuration for the object corresponding to a second location of the object while performing the direct user manipulation;
determining whether the new configuration for the object is acceptable by evaluating at least one of the one or more circuit component layout rules;
configuring a display device to display a single image when the new configuration is acceptable, where the single image corresponds to the new configuration for the object; and
configuring, by using a processor, the display device to simultaneously display a separation of images for the object when the new configuration is not acceptable by violating the at least one of the one or more circuit component layout rules, where the separation of images comprises a first display image of the object at the new configuration for the object and a second display image of the object at a last acceptable configuration for the object before movement of the object to the new configuration violates the at least one of the one or more circuit component layout rules.

12. The method of claim 11 in which the object is moved to an acceptable configuration after being in a state in which the object is in an unacceptable configuration, where the first and second display images are merged into the single image corresponding to the new configuration that is acceptable.

13. The method of claim 11 in which the act of determining whether the new configuration for the object is acceptable is performed by identifying one or more relevant parameters for the object at the new configuration and checking the one or more relevant parameters against the one or more circuit component layout rules of an electronic design layout to determine if there is a violation of a rule condition.

14. The method of claim 13 in which the one or more circuit component layout rules corresponds to an overlap rule, where the overlap rule prohibits a first object from overlapping a second object.

15. The method of claim 14 in which the one or more relevant parameters comprises a location for the object, where a Boolean AND operation is performed for the object at the location against other objects to determine if the overlap rule is violated.

16. The method of claim 11 in which the last acceptable configuration for the object corresponds to a last legal configuration for the object.

17. The method of claim 11 in which the last acceptable configuration for the object corresponds to a configuration for the object that does not violate a circuit component layout rule of an electronic design layout.

18. The method of claim 11 in which the new configuration for the object is not acceptable if the second location causes an overlap of the object with another object.

19. The method of claim 11 in which the graphical user interface is an interface to a computer aided design tool for manipulating graphical design elements.

20. The method of claim 19 in which the computer aided design tool comprises an electronic design automation tool for implementing electronic circuit designs and the graphical design elements comprises electronic design elements.

21. A system for implementing a graphical user interface on a display device, comprising:
 a display device capable of displaying a graphical user interface;
 a pointer device controllable by a user for moving an object in the graphical user interface from a first location to a new location by direct user manipulation of the object in an electronic design layout having one or more circuit component layout rules; and
 a computing system to control image displays on the display device, where the computing system receives instructions corresponding to movement of the pointer device to move the object in the graphical user interface from the first location to a second location, where the computing system identifies a new configuration for the object based at least in part on the second location of the object while performing the direct user manipulation, and determining whether the new configuration for the object is acceptable by evaluating at least one of the one or more circuit component layout rules, where the display device displays a single image when the new configuration is acceptable, where the single image corresponds to the new configuration for the object; and where the display device simultaneously displays a separation of images for the object when the new configuration is not acceptable by violating the at least one of the one or more circuit component layout rules, where the separation of images comprises a first display image of the object at the new configuration for the object and a second display image of the object at a last acceptable configuration for the object before movement of the object to the new configuration violates the at least one of the one or more circuit component layout rules.

22. The system of claim 21 in which the object is moved to an acceptable configuration after being in a state in which the object is in an unacceptable configuration, where the first and second display images are merged into the single image corresponding to the new configuration that is acceptable.

23. The system of claim 21 in which the act of determining whether the new configuration for the object is acceptable is performed by identifying one or more relevant parameters for the object at the new configuration and checking the one or more relevant parameters against the one or more circuit component layout rules of an electronic design layout to determine if there is a violation of a rule condition.

24. The system of claim 21 in which the last acceptable configuration for the object corresponds to a last legal configuration for the object or to a configuration for the object that does not violate a circuit component layout rule of an electronic design layout.

25. The system of claim 21 in which the new configuration for the object is not acceptable if the second location causes an overlap of the object with another object.

26. The system of claim 21 in which the graphical user interface is an interface to a computer aided design tool for manipulating graphical design elements.

27. The system of claim 26 in which the computer aided design tool comprises an electronic design automation tool for implementing electronic circuit designs and the graphical design elements comprises electronic design elements.

* * * * *